United States Patent
Klier

(10) Patent No.: US 6,310,502 B1
(45) Date of Patent: Oct. 30, 2001

(54) BROADBAND PHASE SHIFTING CIRCUIT HAVING TWO PHASE SHIFTER BRANCHES CONNECTED IN PARALLEL

(75) Inventor: Johann Klier, Unterhaching (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 0 days.

(21) Appl. No.: 09/462,997

(22) PCT Filed: Nov. 24, 1998

(86) PCT No.: PCT/EP98/07569

§ 371 Date: May 30, 2000

§ 102(e) Date: May 30, 2000

(87) PCT Pub. No.: WO99/27648

PCT Pub. Date: Jun. 3, 1999

(30) Foreign Application Priority Data

Nov. 25, 1997 (DE) .............................. 197 52 206

(51) Int. Cl.[7] .................................. H03H 11/16
(52) U.S. Cl. ...................... 327/231; 327/244; 327/248
(58) Field of Search .................... 327/231–237, 327/243, 244, 245, 248

(56) References Cited

U.S. PATENT DOCUMENTS

| | | |
|---|---|---|
| 4,558,291 | 12/1985 | Nichols .............................. 333/81 R |
| 4,908,532 | 3/1990 | Chadwick ............................ 327/236 |
| 4,951,000 | 8/1990 | Dautriche ............................ 327/236 |
| 5,101,117 | * 3/1992 | Johnson et al. ...................... 327/244 |
| 5,124,656 | * 6/1992 | Yassa et al. .......................... 327/244 |
| 5,631,591 | * 5/1997 | Bar-Niv ............................... 327/244 |
| 5,644,260 | 7/1997 | DaSilva et al. ...................... 327/238 |

FOREIGN PATENT DOCUMENTS

| | | |
|---|---|---|
| 0 645 885 A1 | 3/1995 | (EP) . |
| 44 20 376 A | 3/1995 | (DE) . |

\* cited by examiner

*Primary Examiner*—Kenneth B. Wells
(74) *Attorney, Agent, or Firm*—Schiff Hardin & Waite

(57) ABSTRACT

A broadband phase-shifting circuit, in particular for an IQ modulator, has two phase-shifting branches connected in parallel, to the input of which is supplied the input signal of which the phase is to be shifted, and which supply at their outputs output signals of which the phase is shifted over a predetermined angle, in particular of 90°. The phase shifter of one phase-shifting branch is controlled depending on the frequency of the input signal in such a way that the phase angle between the two output signals approximately corresponds to the desired value (coarse control), whereas the phase shifter of the other phase-shifting branch is set to the desired phase angle (fine regulation by a phase detector connected between the outputs of the two phase-shifting branches.

12 Claims, 1 Drawing Sheet

BROADBAND PHASE SHIFTING CIRCUIT HAVING TWO PHASE SHIFTER BRANCHES CONNECTED IN PARALLEL

BACKGROUND OF THE INVENTION

The invention is directed to a broadband phase shifter circuit.

More specifically, the invention is directed to a broadband phase shifter circuit, particularly for an IQ modulator, comprising two phase shifter branches connected parallel to which the input signal to be shifted in phase is supplied at the input side and that supply phase-shifted output signals at their outputs shifted by a predetermined angle, such as 90°.

Broadband phase shifter circuits of this species are known; for example, they are employed as 90° phase shifters for IQ modulators (for example, according to U. S. Pat. Nos. 4,908,532, 4, 951,000 or 5,644,260). However, these respectively have various disadvantages. The fashioning of the phase shifters as RC elements with variable capacitance diodes and their regulation via a phase detector connected between the outputs (U.S. Pat. No. 4,908,532) results in indefinite amplitudes of the output voltages at the two phase shifter branches. The different amplitudes deteriorate the modulation precision of the following IQ modulator. The opposed phase correction of two identical phase shifters in the two phase shifter branches via a phase detector (U.S. Pat. No. 4,951,000) is limited to specific phase shifters and cannot be employed, for example, given simple RC elements. The regulation of the two phase shifter branches dependent on the difference of the amplitude of the two output voltages (U.S. Pat No. 5,644,260) is not exact enough with respect to adhering to the desired, exact phase relationship.

SUMMARY OF THE INVENTION

It is therefore an object of the invention to create a broadband phase shifter circuit that avoids these disadvantages and assures exact adherence to the desired phase angle, given amplitudes of the output voltages of respectively the same size in a broad frequency range regardless of the kind of phase shifters employed.

To that end, in an embodiment the invention provides a phase shifter circuit in which the phase shifter of the one phase shifter branch is controlled dependent on the frequency (f) of the input signal such that the phase angle between the two output signals approximately corresponds to the desired value (rough control); and the phase shifter of the other phase shifter branch is regulated to the desired phase angle via a phase detector connected between the outputs of the two phase shifter branches (fine control).

In an embodiment, the invention provides a broadband phase shifter circuit, comprising: two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes.

In an embodiment of the invention, the phase shifter of the one phase shifter branch comprises an RC low-pass element and the phase-shifter of the other phase-shifter branch comprises an RC high-pass element.

In an embodiment of the invention, the phase shifters in the phase shifter branches comprise all-pass filters.

In an embodiment of the invention, there are included respective variable resistors for effecting the rough control and fine control.

In an embodiment of the invention, the variable resistors comprise drain-source paths of field effect transistors.

In an embodiment of the invention, there is included respective variable capacitances for effecting the rough control and fine control.

In an embodiment of the invention, there is included the phase shifters of the two phase shifter branches comprise RL elements with variable resistors.

In an embodiment of the invention, the phase shifters of the two phase shifter branches comprise RL elements with variable resistors and variable inductances.

In an embodiment of the invention, the actuating variables belonging to the respective frequency for the rough control are stored in a memory and are read therefrom dependent upon the frequency of the input signal.

In the inventive phase shifter circuit, one phase shifter branch, dependent on the frequency of the input signal, is roughly set to a value that approximately corresponds to the desired, predetermined phase angle. Only the second phase shifter branch is re-adjusted so finely via a phase detector that the desired, predetermined phase angle, for example 90°, is ultimately achieved. This principle of rough presetting and fine readjustment is suitable for all possible phase shifters, both for simple RC elements as well as for all-pass elements, delay elements or phase shifter circuits upon employment of inductances as well. The only precondition is that the phase shifters employed can be respectively dimensioned such in the two phase shifter branches that the output signals at their two outputs respectively exhibit the desired phase angle. Since, according to the invention, fine regulation is undertaken via the phase detector directly dependent on the phase and not via the expedient of an amplitude comparison, the circuit is also insensitive to temperature effects and aging of the components. As a result of the combined rough control / fine adjustment, preferably via variable resistors in the phase shifters of the branches, an inventive phase shifter circuit is extremely broadband over up to two frequency decades.

The invention is explained in greater detail below on the basis of schematic drawings with reference to an exemplary embodiment.

These and other features and aspects of the invention will become clear in the following detailed description of a few typical exemplary embodiments with reference to the accompanying drawings.

DETAILED DESCRIPTION OF THE PRESENTLY PREFERRED EMBODIMENTS

Figure 1:
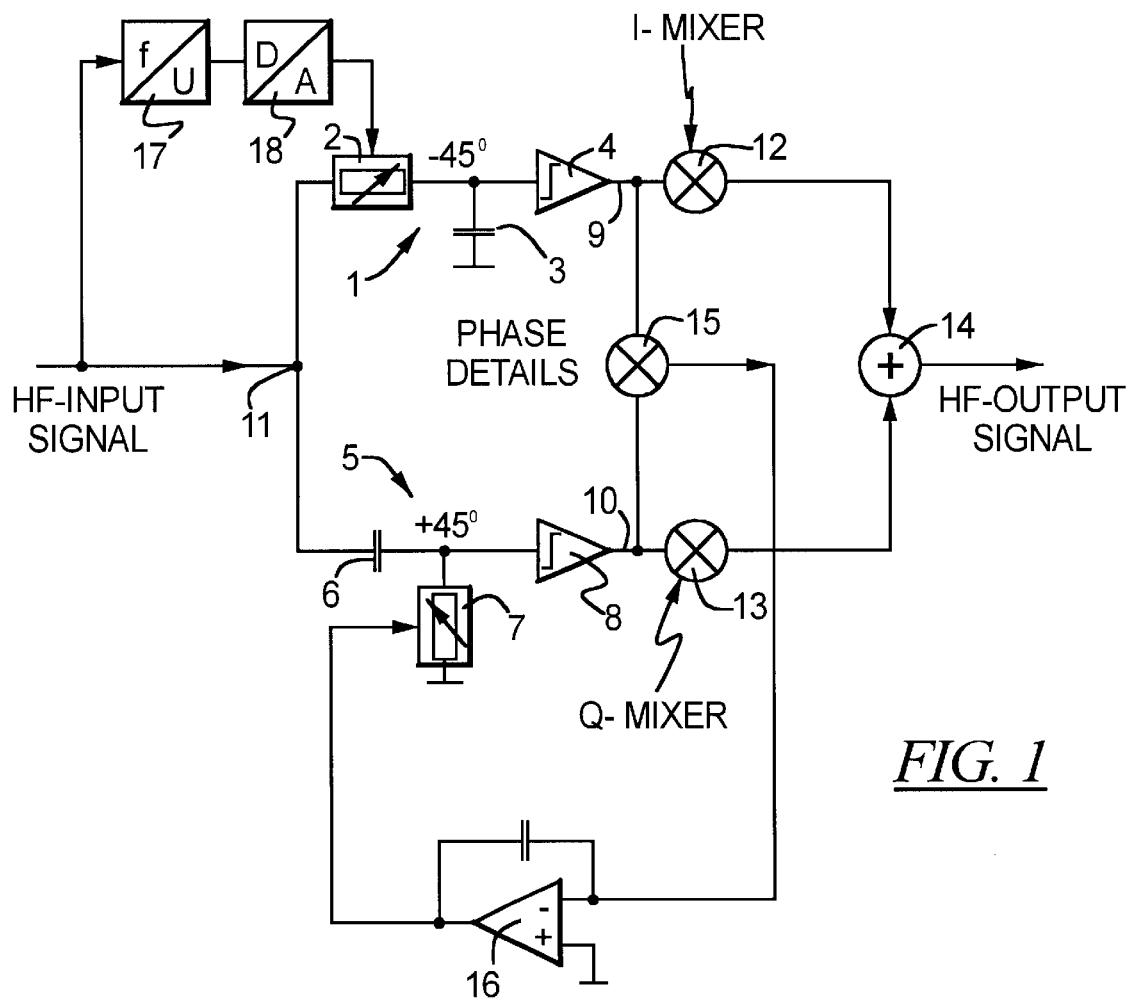
FIG. 1 illustrates a phase shifter circuit embodying principles of the invention.

FIG. 1 shows the schematic diagram of an inventive broadband phase shifter circuit, namely applied in an IQ modulator. The one phase shifter branch 1 is formed by a low-pass with a variable resistor 2 and a fixed capacitor 3 plus following limiter 4; the other phase shifter branch 5 is formed by a high-pass with a fixed capacitor, a variable resistor 7 and a following limiter 8. The low-pass generates a phase shift of −45°, the high-pass a phase shift of +45°. A high-frequency input signal supplied to the common input 11 is divided via the two phase shifter branches 1 and 5 into two output signal components at the outputs 9 and 10 that exhibit an exact 90° phase shift relative to one another. The output 9 is connected to the mixer 12 for the I-input; the output 10 is connected to the mixer 13 for the Q-input of the IQ modulator. The outputs of the mixers are combined in an adder 14. The 90° phase shifter generates the two signal components of the carrier signal supplied to the input 11 that are phase-shifted by 90° relative to one another.

A phase detector 15, for example a multiplier, whose output is connected via a controlled-gain amplifier 16 to the variable resistor 7 of the high-pass is inserted between the outputs 9 and 10 of the limiters. The variable resistor of the low-pass is controlled dependent on the frequency of the HF input signal. The two variable resistors 2 and 7, for example, are formed by the drain-source path of a field effect transistors that is variable via the gate terminal.

The control of the resistor 2 dependent on the frequency ensues via a memory 17 in which the appertaining actuating variables U for the resistor 2 are stored a digital values for the frequency values f of the HF input signal. The actuating variable U selected dependent on the input frequency f is converted via a digital-to-analog converter 18 into a corresponding analog actuating variable for the resistor 2, for example the gate control voltage for a field effect transistor. In the simplest case given a constant input frequency, the input of the respective frequency value f can ensue manually by the user; a corresponding frequency meter can be used given changing frequency. In most cases, the frequency of the HF input signal in such applications is present as digital value, and the appertaining actuating variable U can then be read directly from the memory 17 therewith.

Via the resistor 2, the low-pass is roughly pre-set to a value that approximately yields a phase shift of −45° with a precision of +5°. Via the control circuit of the phase detector 15, the resistor 7 of the high-pass is then re-adjusted such that the output signals at the outputs 9 and 10 exhibit the desired, exact 90° phase shift, the output of the phase detector thus supplied the actuating variable 0.

According to the inventive principle, not only can a mutual 90° phase shift be exactly set, but any arbitrary phase angle between 0 and 180°. For example, this can occur in a simple way in that a corresponding comparison voltage is applied to the +-input of the controlled-gain amplifier 16, and the phase between the output signals is then regulated to this predetermined voltage offset.

The size of the frequency steps under which the respective actuating variables U are stored in the memory 17 is based on the desired precision. The relationship between frequency f and actuating variable U is preferably determined via a one-time calibration event in which the respectively appertaining actuating variables U are determined in steps of approximately 10% frequency change for various frequency reference values within the band width in which the phase shifter is to be operated.

Figure 2:
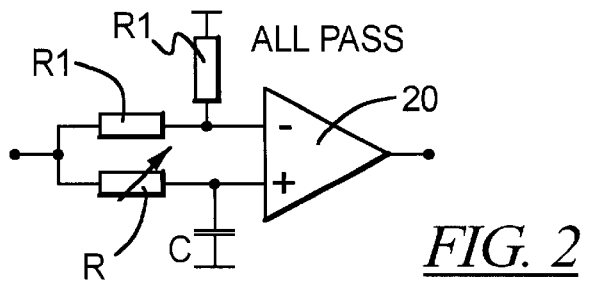
FIG. 2 illustrates an all-pass filter that can be used in the circuit of FIG. 1.

Instead of the CR elements 2, 3 or, RC elements 6, 7, all-passes can also be utilized in the two phase shifters 1 and 5. The schematic diagram of such an all-pass is shown in FIG. 2. All-passes have the advantage that the output level remains constant regardless of the frequency or phase shift. Due to the constant frequency response of an all-pass, a specific operating point no longer has to be adhered to, as is the case given RC elements. As a result thereof, a larger frequency range can be covered with the same variation of the resistors.

Given an all-pass according to FIG. 2, the amount of the gain is equal to 1 when the differential amplifier 20 has a gain of 2. The gain is then +1 at low frequencies and −1 at high frequencies. By varying the resistor R, a phase shift can be set between 0° and −180° without influencing the amplitude. The phase shift amounts to $\phi=-2\arctan(2\pi f R C)$.

The two limit frequencies of the all-passes utilized in the two phase shifters 1 and 5 are preferably shifted so far from one another that at least the desired phase difference can be set with adequate reserve. Due to the independence from the amplitude, the all-pass in the first phase shifter branch 1 can be set in far rougher steps; the difference phase must merely achieved the desired value of, for example, 90°. For example, it is possible to set the first all-pass in the phase shifter branch 1 to −5° and to adjust the all-pass in the phase shifter branch 5 to −95° via the control loop. Given a frequency change, the phase in the phase shifter branch 1 changes to, for example, −50° with a new pre-setting. The regulation then sets the second allpass in the phase shifter branch 5 to −140°. As long as the range of control of the all-pass in the phase shifter branch 5 is still adequate, the pre-setting need not be modified.

Such a phase shifter constructed with all-passes can thus, for example, be operated broadband in a frequency range from 100 MHz to 5 GHz by varying the resistors over a decade.

The all-passes in the two branches 1 and 5 have the respectively same structure and, for example, are constructed according to FIG. 2; their limit frequency is merely selected correspondingly different. Instead of the rough control and fine regulation via the resistor R, the respective control and regulation given the all-passes can also ensue via a variation of the capacitance C that, for example, are [sic] fashioned as capacitance diodes. This is also possible given the RC elements 2, 3 or, respectively, 6, 7 according to FIG. 1; here, too, variable capacitance diodes can be utilized instead of the variable resistors. A mixing of these control and regulating possibilities is also conceivable. The phase shifters could also be constructed as RL elements with variable resistors or variable inductances.

Although modifications and changes may be suggested by those skilled in the art, it is the intention of the inventors to embody within the patent warranted hereon all changes and modifications as reasonably and properly come within the scope of their contribution to the art.

What is claimed is:

1. A broadband phase shifter circuit, comprising:
    two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein actuating variables belonging to the respective frequency for the rough control are stored in a memory and are read therefrom dependent upon the frequency of the input signal.

2. A broadband phase shifter circuit, comprising:

two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein the phase shifter of the phase shifter branch comprises an RC low-pass element and the phase-shifter of the other phase-shifter branch comprises an RC high-pass element.

3. A phase shifter circuit according to claim 2, including respective variable resistors for effecting the rough control and fine control.

4. A phase shifter circuit according to claim 3, wherein the variable resistors comprise drain-source paths of field effect transistors.

5. A phase shifter circuit according to claim 2, comprising respective variable capacitances for effecting the rough control and fine control.

6. A broadband phase shifter circuit, comprising:

two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein the phase shifters in the phase shifter branches comprise all-pass filters.

7. A phase shifter circuit according to claim 6, including respective variable resistors for effecting the rough control and fine control.

8. A phase shifter circuit according to claim 7, wherein the variable resistors comprise drain-source paths of field effect transistors.

9. A phase shifter circuit according to claim 6, comprising respective variable capacitances for effecting the rough control and fine control.

10. A broadband phase shifter circuit, comprising:

two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein the phase shifters of the two phase shifter branches comprise RL elements with variable resistors.

11. A broadband phase shifter circuit, comprising:

two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein the phase shifters of the two phase shifter branches comprise RL elements with variable inductances.

12. A broadband phase shifter circuit, comprising:

two phase shifter branches connected in parallel to which an input signal to be shifted in phase is supplied at a common input side and which supply at respective outputs phase-shifted output signals shifted by a predetermined angle, wherein, each phase shifter branch comprises a phase shifter, the phase shifter of one phase shifter branch is controlled dependent on the frequency of the input signal such that the phase angle between the phase-shifted two output signals approximately corresponds to a desired value for relatively rough control purposes, the phase shifter of the other phase shifter branch is controlled to the desired phase angle via a phase detector connected between the outputs of the two phase shifter branches for relatively fine control purposes, wherein the phase shifters of the two phase shifter branches comprise RL elements with variable resistors and variable inductances.

* * * * *